(12) United States Patent
Mori et al.

(10) Patent No.: US 8,035,217 B2
(45) Date of Patent: Oct. 11, 2011

(54) SEMICONDUCTOR DEVICE AND METHOD FOR MANUFACTURING SAME

(75) Inventors: Kentaro Mori, Tokyo (JP); Shintaro Yamamichi, Tokyo (JP); Hideya Murai, Tokyo (JP); Takuo Funaya, Tokyo (JP); Masaya Kawano, Kanagawa (JP); Takehiko Maeda, Kanagawa (JP); Kouji Soejima, Kanagawa (JP)

(73) Assignees: NEC Corporation, Tokyo (JP); Renesas Electronics Corporation, Kanagawa (JP)

( * ) Notice: Subject to any disclaimer, the term of this patent is extended or adjusted under 35 U.S.C. 154(b) by 472 days.

(21) Appl. No.: 12/135,355

(22) Filed: Jun. 9, 2008

(65) Prior Publication Data

US 2008/0303136 A1    Dec. 11, 2008

(30) Foreign Application Priority Data

Jun. 8, 2007    (JP) ................................. 2007-153293

(51) Int. Cl.
    *H01L 23/12*    (2006.01)
(52) U.S. Cl. ........ 257/700; 257/690; 257/698; 257/750; 257/758; 257/E23.063; 257/E23.169
(58) Field of Classification Search ................. 257/698, 257/700, 702, E23.039, E21.505, 690, 701, 257/730, 734, 736, 750, 758, 781, E23.006, 257/E23.011, E23.063, E23.169
See application file for complete search history.

(56) References Cited

U.S. PATENT DOCUMENTS

| | | | | |
|---|---|---|---|---|
| 5,355,283 A | * | 10/1994 | Marrs et al. | 361/760 |
| 5,436,203 A | * | 7/1995 | Lin | 29/841 |
| 6,982,478 B2 | * | 1/2006 | Nakamura | 257/676 |
| 7,208,827 B2 | * | 4/2007 | Hauser et al. | 257/687 |
| 7,563,650 B2 | * | 7/2009 | Nishikawa | 438/125 |
| 7,723,838 B2 | * | 5/2010 | Takeuchi et al. | 257/700 |

FOREIGN PATENT DOCUMENTS

| | | |
|---|---|---|
| CN | 1768557 | 5/2006 |
| JP | 2001-237362 | 8/2001 |
| JP | 2001-250902 | 9/2001 |
| JP | 2002-016173 | 1/2002 |

OTHER PUBLICATIONS

Chinese Official Action—200810125539.4—Dec. 27, 2010.

* cited by examiner

*Primary Examiner* — Jasmine Clark
(74) *Attorney, Agent, or Firm* — Young & Thompson

(57) ABSTRACT

A transparent board is positioned on a support board provided with a positioning mark, and a release material is provided. A semiconductor element is then positioned so that the electrode element faces upward, and the support board is then removed. An insulating resin is then formed on the release material so as to cover the semiconductor element; and a via, a wiring layer, an insulation layer, an external terminal, and a solder resist are then formed. The transparent board is then peeled from the semiconductor device through the use of the release material. A chip can thereby be mounted with high precision, there is no need to provide a positioning mark during mounting of the chip on the substrate in the manufacturing process, and the substrate can easily be removed. As a result, a semiconductor device having high density and a thin profile can be manufactured at low cost.

20 Claims, 8 Drawing Sheets

SEMICONDUCTOR DEVICE AND METHOD FOR MANUFACTURING SAME

BACKGROUND OF THE INVENTION

1. Field of the Invention

The present invention relates to a semiconductor device that houses a semiconductor element, and to a method for manufacturing the semiconductor device.

2. Description of the Related Art

Size reduction, increased functionality, and increased performance of electronic devices have been in demand in recent years, and high-density packaging techniques for semiconductor packaging have therefore become essential. Wire bonding connection using metal wire or the like, and flip-chip connection using solder balls, have been used as conventional methods for connecting a wiring board with a semiconductor element, but these methods all have such problems as are described below. For example, wire bonding connection has the merit of low cost, but because the wire diameter must be reduced in narrower pitches, wire breakage and confined connection conditions occur. In flip-chip connection, higher speed transmission is possible than in a wire bonding connection, but in the case of narrow-pitch connections or a large number of terminals in the semiconductor element, the connection strength of the solder bumps is reduced, and there is therefore an increased occurrence of cracking in the connection locations, and connection defects are created by voids.

Therefore, semiconductor devices in which a semiconductor element is built into a board, i.e., semiconductor element embedding techniques, have been recently proposed as high-density packaging techniques that make it possible to achieve increased integration and functionality of semiconductor devices, and that have numerous merits such as reduced package profile, reduced cost, high-frequency response, and low-stress connection by plating connections. Semiconductor devices that utilize the semiconductor element embedding technique are disclosed in Japanese Patent Application Kokai Publication Nos. 2002-16173, 2001-250902, and 2001-237362, for example.

However, in the conventional semiconductor element embedding technique, a semiconductor element (chip) is first mounted on one side, on both sides, or in a concave part provided to a flat surface of a substrate composed of resin or metal. Because of cost and other reasons, a substrate composed of resin or metal and used in a board process must be a large sheet, but because of warping, swelling, and lack of flatness in a substrate composed of resin or metal, it becomes difficult to mount the chip on the substrate with high precision. Since a positioning mark for mounting the chip must also be provided in advance on the substrate, the step for forming the positioning mark contributes to increased cost.

As shown in FIGS. 1 and 2, a conventional semiconductor device has positioning marks 22 or depressions 27 based on such positioning marks. However, the positioning marks 22 and the depressions 27 based on such positioning marks act as non-flat portions of the surface of an insulation resin 12 and are the origins of cracks, and therefore cause reduced reliability of the semiconductor device. When the substrate is metal, the metal must be etched to remove the substrate after manufacturing in order to reduce the thickness of the semiconductor device. Consequently, costs are increased by the increased amount of processing.

SUMMARY OF THE INVENTION

An object of the present invention is to provide a semiconductor device in which a chip can be mounted with high precision, there is no need to provide a positioning mark for positioning the chip on a substrate, the substrate can easily be removed in the manufacturing process, and high density and a thin profile can be achieved at low cost; and to provide a method for manufacturing the semiconductor device.

The semiconductor device according to the present invention comprises a semiconductor element having an electrode terminal; an insulation layer formed so as to seal a side surface and a surface provided with the electrode terminal of the semiconductor element; and one or more wiring layers electrically connected to the electrode terminal; wherein a surface opposite from the surface on the side provided with the wiring layer in the insulation layer is a flat surface that is parallel to a surface on a side that is opposite from the surface provided with the electrode terminal of the semiconductor element.

In this case, the surface on a side that is opposite from the surface provided with the electrode terminal of the semiconductor element may be in the same plane as the flat surface of the insulation layer. The surface on a side that is opposite from the surface provided with the electrode terminal of the semiconductor element may also protrude or be recessed in relation to the flat surface.

A cured adhesion layer may be formed on the surface on a side that is opposite from the surface provided with the electrode terminal of the semiconductor element, or a cured adhesion layer may be formed on the flat surface of the insulation layer. Furthermore, a cured adhesion layer may be formed on the surface on a side that is opposite from the surface provided with the electrode terminal of the semiconductor element, and on the flat surface of the insulation layer.

Furthermore, a transparent board may be provided to the side that is opposite from the surface provided with the electrode terminal of the semiconductor element. In this case, the transparent board may be configured to be a glass board, or a metal via that passes through the transparent board may be provided to the transparent board.

Furthermore, a heat sink may be provided to the side that is opposite from the surface provided with the electrode terminal of the semiconductor element.

The method for manufacturing a semiconductor device according to the present invention comprises the steps of positioning a transparent board flat-side-up on a support board provided with a positioning mark for mounting a semiconductor element; mounting the semiconductor element on the transparent board using the positioning mark on the support board as a reference so that a surface provided with an electrode terminal faces upward; removing the support board after the semiconductor element is mounted; forming an insulation layer on the transparent board so as to seal a side surface and the surface provided with the electrode terminal of the semiconductor element; forming one or more wiring layers electrically connected to the electrode terminal of the semiconductor element; and peeling off the transparent board.

The method for manufacturing a semiconductor device according to another aspect of the present invention comprises the steps of positioning a transparent board flat-side-up on a support board provided with a positioning mark for mounting a semiconductor element; mounting the semiconductor element on the transparent board using the positioning mark on the support board as a reference so that a surface provided with an electrode terminal faces upward; removing the support board after the semiconductor element is mounted; forming an insulation layer on the transparent board so as to seal a side surface and the surface provided with the electrode terminal of the semiconductor element; and forming one or more wiring layers electrically connected to the electrode terminal of the semiconductor element.

In this case, the transparent board may be a glass board, or a via may be provided so as to pass through the transparent board in the step of positioning the transparent board.

A release material may be provided on the transparent board in the step of positioning the transparent board, and the release material may be a photo-curable material.

Furthermore, the semiconductor element may be mounted via an adhesion layer in the step of mounting the semiconductor element.

Furthermore, a heat sink may be mounted on a side that is opposite from the surface provided with the electrode terminal of the semiconductor element.

The present invention makes it possible to obtain a high-density, thin-profile, low-cost semiconductor device and a method for manufacturing the same whereby a chip can be mounted with high precision and whereby a substrate can easily be removed without the need to provide a positioning mark during mounting of the chip on the substrate in the manufacturing process.

DESCRIPTION OF THE PREFERRED EMBODIMENTS

Figure 1:
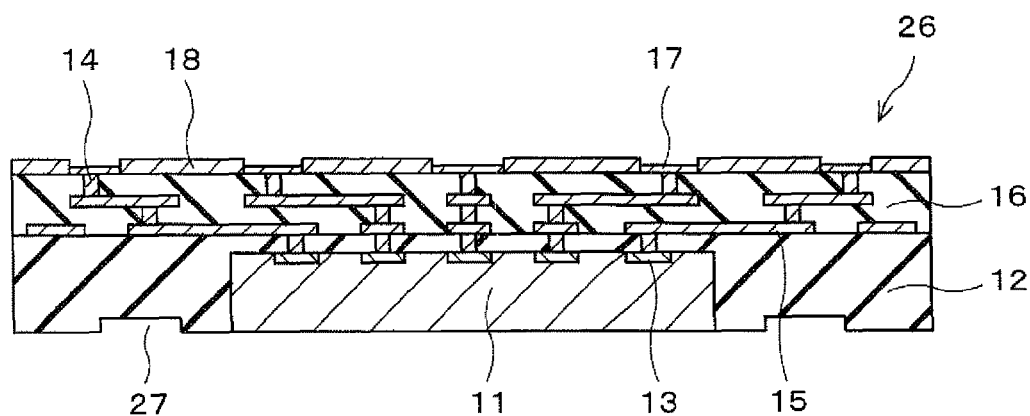
FIG. 1 is a sectional view showing the first conventional semiconductor device.

In the present invention, an insulation layer seals a side surface and a surface provided with an electrode terminal of the semiconductor element, and a flat surface is provided to the surface on a side that is opposite from the surface provided with the electrode terminal. The flat surface is created by placing a semiconductor element in a so-called face-up state on a transparent board made of glass, for example, and then forming an insulation layer so as to seal the side surface and the surface provided with the electrode terminal of the semiconductor element. Since warping, swelling, surface irregularity, and the like are extremely minimal in a glass board, a semiconductor element having an increased degree of integration can be mounted in the desired position with high precision even when the transparent board is a large sheet. Since the flat surface formed on the insulation layer also has extremely minimal warping and the like, a heat sink or other component can also be mounted with high precision on this surface.

In the present invention, a transparent board as a substrate is positioned on a support board provided with a positioning mark for mounting the semiconductor element, and the semiconductor element, the insulation layer, and other components are positioned or formed on the transparent board. Since the positioning marks on the support board are recognized through the transparent board during positioning of the semiconductor element, the positioning marks and depressions/protrusions based on such positioning marks are not allowed to remain in the semiconductor device, particularly in the insulation layer. Cracking, which tends to occur in these portions in the conventional technique, is thereby prevented, and the reliability of the semiconductor device can be enhanced. In the present invention, the phrase "flat surface of the insulation layer" is assumed to mean that the abovementioned positioning marks and warping caused by the positioning mark do not remain on the surface of the insulation layer.

The profile size of the semiconductor device can be reduced by removing the transparent board from the semiconductor device during the process of manufacturing, but the transparent board may also be integrated with the semiconductor device. A step for forming a positioning mark for each semiconductor device can also be eliminated by reusing the support board after the support board is removed during manufacturing.

Furthermore, the transparent board can easily be peeled from the semiconductor device by providing a release material between the transparent board and the semiconductor element and insulation layer. Particularly through the use of a photo-curable release material, the transparency of the glass can be utilized to radiate light from the lower surface of the transparent board for easy separation. Providing an adhesion layer also makes it possible to retain the semiconductor device in a prescribed position and to form wiring layers and the like with high precision. The release material and the adhesion layer may also be jointly used.

Figure 3:
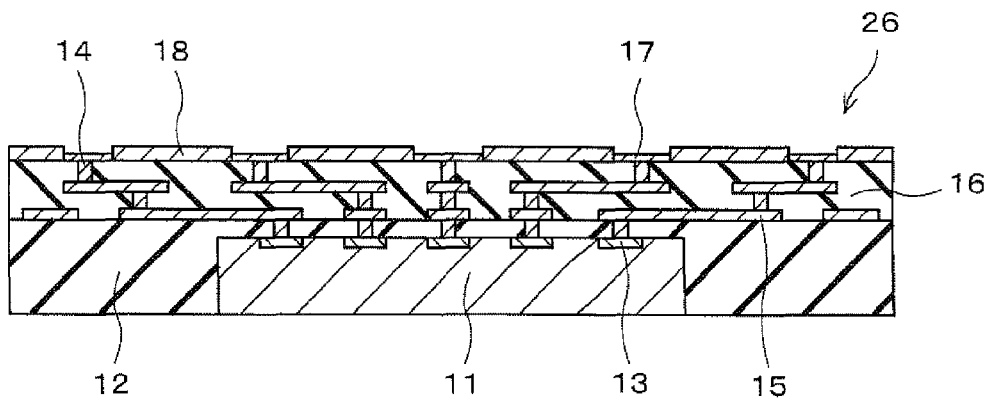
FIG. 3 is a sectional view showing the semiconductor device according to a first embodiment of the present invention.
Figure 4:
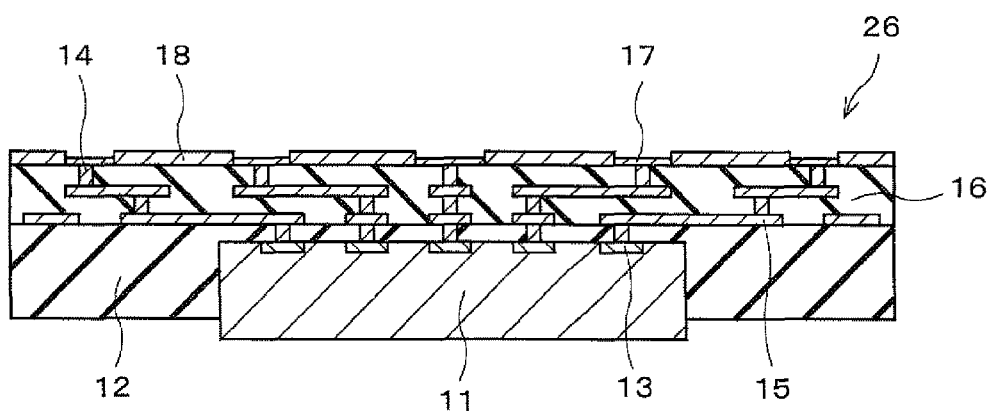
FIG. 4 is a sectional view showing a first modification of the semiconductor device according to the first embodiment.

Embodiments of the present invention will be described in detail hereinafter with reference to the accompanying drawings. A first embodiment of the present invention will first be described. FIG. 3 is a sectional view showing the semiconductor device according to the first embodiment. The abovementioned insulation layer is equivalent to the insulation resin 12 in the description of the embodiments given hereinafter.

As shown in FIG. 3, the semiconductor device 26 of the present embodiment is provided with a semiconductor element 11 having an electrode terminal 13 on a first surface thereof. An insulation resin 12 is formed so as to seal the side surface and the surface provided with the electrode terminal 13 of the semiconductor element 11. A via 14, an insulation layer 16, and a wiring layer 15 for electrically connecting the electrode terminal 13 to an external terminal 17 of the semiconductor device 26 are provided to the upper surface of the electrode terminal 13. A solder resist 18 is provided on the surface of the insulation layer 16 so as to expose a portion of the external terminal 17 and to cover the remaining portion thereof. In the semiconductor element 11, the surface on a side that is opposite from the surface to which the electrode terminal 13 is provided is exposed from the insulation resin 12, and the insulation layer 12 is not provided with positioning marks and depressions/protrusions based on such positioning marks for positioning the semiconductor element 11. The lower surface of the insulation resin 12 is parallel to the back surface of the semiconductor element 11, and is in the same plane as the back surface of the semiconductor element 11 in the present embodiment. The lower surface of the insulation resin 12 also has a high degree of flatness. Although not shown in the drawings, a heat sink or other component may be mounted on the same flat surface described above. With regard to the semiconductor element 11 in the present specification, the surface on a side that is opposite from the surface to which the electrode terminal 13 is provided is referred to as the back surface of the semiconductor element 11. In the insulation resin 12, the surface on the back side of the semiconductor element 11 is referred to as the lower surface of the insulation resin 12.

The insulation resin 12 is formed from a photosensitive or non-photosensitive organic material, for example. Examples of organic materials that can be used include epoxy resin, epoxy acrylate resin, urethane acrylate resin, polyester resin, phenol resin, polyimide resin, BCB (benzocyclobutene), PBO (polybenzoxazole), polynorbornene resin, and the like, as well as glass cloth or a woven or nonwoven cloth formed by aramid fibers or the like that is impregnated with epoxy resin, epoxy acrylate resin, urethane acrylate resin, polyester resin, phenol resin, polyimide resin, BCB, PBO, polynorbornene resin, or the like.

The primary component of the wiring layer 15 is one or more types of metal selected from the group consisting of copper, silver, gold, nickel, aluminum, and palladium. Copper is most preferred from the perspectives of electrical resistance and cost.

The insulation layer 16 is formed from a photosensitive or non-photosensitive organic material, for example. Examples of organic materials that can be used include epoxy resin, epoxy acrylate resin, urethane acrylate resin, polyester resin, phenol resin, polyimide resin, BCB, PBO, polynorbornene resin, and the like, as well as glass cloth or a woven or nonwoven cloth formed by aramid fibers or the like that is impregnated with epoxy resin, epoxy acrylate resin, urethane acrylate resin, polyester resin, phenol resin, polyimide resin, BCB, PBO, polynorbornene resin, or the like. The insulation layer 16 may also be formed using the same material as the insulation resin 12.

In the embodiment shown in FIG. 3, the wiring layer 15 comprises two layers, and the insulation layer 16 comprises three layers, but this configuration is not limiting, and the wiring layer 15 and the insulation layer 16 may be composed of the necessary number of layers. The wiring layer 15 is formed in the region of the insulation layer 16 in FIG. 3, but a configuration may be adopted in which the first layer of the wiring layer 15 as viewed from the semiconductor element 11 is formed in the region of the insulation resin 12.

The same material as the wiring layer 15 may be selected and used as the external terminal 17, and one or more types of metal selected from the group consisting of gold, silver, copper, tin, and solder material may be formed on the surface of the external terminal 17. A photosensitive resist ink, for example, may be used as the solder resist 18.

In the present embodiment, a configuration is adopted in which the lower surface of the insulation resin 12 is a highly flat surface. The reason for this is that the semiconductor element 11 is placed on a transparent glass plate having a flat surface, and the insulation resin 12 is then formed thereon as described hereinafter in the description of the manufacturing method. A glass plate has extremely minimal warping, swelling, surface irregularities, and the like in comparison to resin, metal, or the like. A glass plate is also used as the substrate in the semiconductor element 11. The semiconductor element 11 can therefore be mounted in the intended position on the glass plate with high precision. Since the back surface of the semiconductor element 11 and the lower surface of the insulation resin 12 are in the same plane, and the lower surface of the insulation resin 12 is a highly flat surface, a heat sink or other component can also be stably mounted with high precision on the back surface of the semiconductor element 11.

In the present embodiment, the semiconductor device 26, and particularly the insulation resin 12, is free of positioning marks and depressions/protrusions based on such positioning marks for mounting the semiconductor element 11. This is because the positioning marks are provided to a support board that is not included in the semiconductor device 26, as described hereinafter in the description of the manufacturing method. Specifically, when the semiconductor element 11 is positioned, the positioning marks are visible through the glass plate positioned between the semiconductor device 26 and the support board. As mentioned above, since the glass plate has a high degree of flatness, the semiconductor element 11 can be properly positioned without providing positioning marks to the insulation resin 12 and other components. Since the semiconductor device 26 is thus free of positioning marks and depressions/protrusions based on such positioning marks, cracks that easily formed in these portions in the conventional technique can be prevented, and the reliability of the semiconductor device 26 can be enhanced.

The semiconductor device of the present embodiment described above is a single-sided terminal semiconductor device in which the external terminal 17 is provided to one side of the semiconductor device 26, but the present invention is not limited to this configuration. For example, a double-sided terminal semiconductor device may be created by providing a via that exposes the back surface of the semiconductor element 11.

Figure 2:
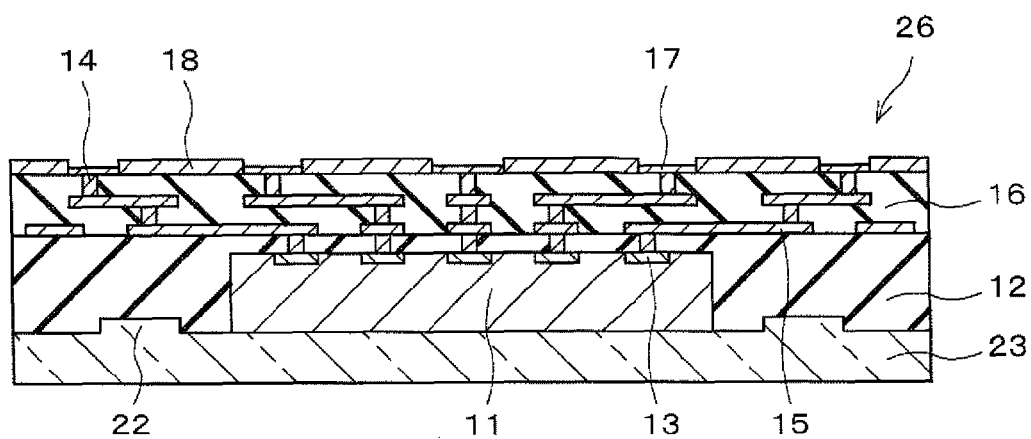
FIG. 2 is a sectional view showing the second conventional semiconductor device.

In the semiconductor device of the present embodiment described above, the back surface of the semiconductor element 11 is in the same plane as the lower surface of the insulation resin 12, but the present invention is not limited to this configuration. For example, as shown in FIG. 2, the back surface of the semiconductor element 11 may protrude in relation to the lower surface of the insulation resin 12. Through such a configuration, the semiconductor element 11 has a greater exposed surface area, and heat dissipation characteristics can therefore be enhanced. The thickness of the semiconductor element 11 can also be adjusted by processing the protruding part of the semiconductor element 11.

Figure 5:
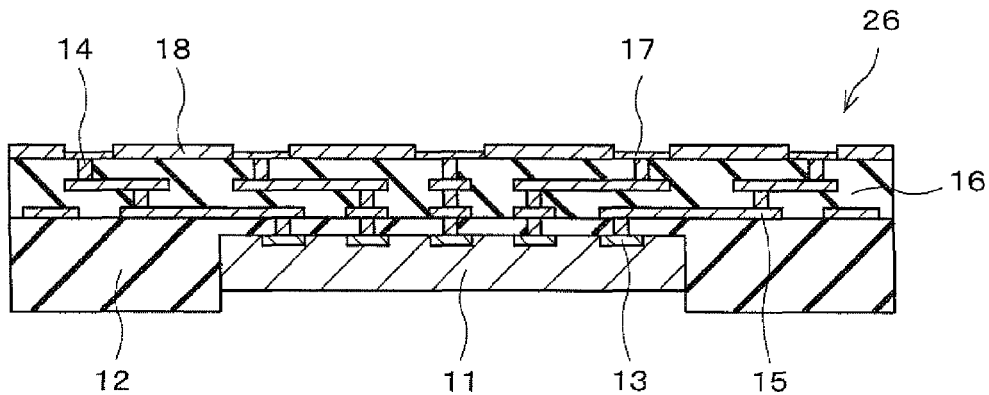
FIG. 5 is a sectional view showing a second modification of the semiconductor device according to the first embodiment.

Furthermore, as shown in FIG. 5, a configuration may be adopted in which the back surface of the semiconductor element 11 is recessed in relation to the lower surface of the insulation resin 12. Through such a configuration, the end parts of the semiconductor element 11 can be prevented from peeling and chipping.

Furthermore, a condenser for acting as a circuit noise filter may be provided in a prescribed position of the wiring assembly composed of the via 14, the wiring layer 15, and the insulation layer 16. Preferred inductor materials for forming the condenser include titanium oxide, tantalum oxide, $Al_2O_3$, $SiO_2$, $ZrO_2$, $HfO_2$, $Nb_2O_5$, and other metal oxides; BST ($Ba_xSr_{1-x}TiO_3$), PZT ($PbZr_xTi_{1-x}O_3$), PLZT ($Pb_{1-y}La_yZr_xTi_{1-x\ O_3}$), and other perovskite-based materials; and $SrBi_2Ta_2O_9$ and other Bi-based laminar compounds. In the formulae above, the relationships $0 \leq x \leq 1$ and $0 < y < 1$ are satisfied. Inorganic materials, organic materials mixed with a magnetic material, and the like may be used as the inductor material for forming the condenser. Resistors and other discrete components may be furthermore provided in addition to the semiconductor element and the condenser.

Furthermore, a stiffener, a heat spreader, or the like may be mounted on the back surface of the semiconductor element 11.

Figure 6:
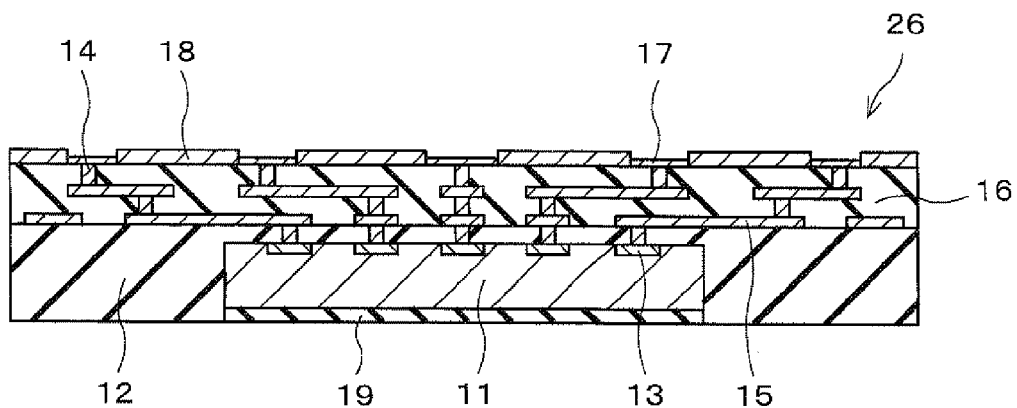
FIG. 6 is a sectional view showing the semiconductor device according to a second embodiment of the present invention.

A second embodiment of the present invention will next be described. FIG. 6 is a sectional view showing the semiconductor device according to the second embodiment. Since items other than those described below in FIG. 6 are the same as in the first embodiment, the same reference symbols are used in FIG. 6 to refer to components that are the same as in FIG. 3, and no detailed description thereof will be given.

As shown in FIG. 6, the back surface of the semiconductor element 11 is recessed in relation to the lower surface of the insulation resin 12 in the semiconductor device 26 of the present embodiment. A cured adhesive material 19 is provided in the depression, and the exposed surface of the adhesive material 19 is in the same plane as the lower surface of the adjacent insulation resin 12. Aspects of the configuration other than those described above are the same as in the first embodiment shown in FIG. 3, and there are also no positioning marks and depressions/protrusions based on such positioning marks provided to the insulation resin 12 in order to mount the semiconductor element 11.

The adhesive material 19 is a photosensitive or non-photosensitive organic material, for example. Examples of materials that can be used as the adhesive material 19 include epoxy resin, epoxy acrylate resin, urethane acrylate resin, polyester resin, phenol resin, polyimide resin, BCB, PBO, polynorbornene resin, and the like.

In the present embodiment, the cured adhesive material 19 is provided in the depression formed by the insulation resin 12 and the back surface of the semiconductor element 11. The cured adhesive material 19 is provided in order to increase adhesion when the semiconductor element 11 is positioned on the substrate and the release material in the manufacturing method (FIG. 13) described hereinafter. By positioning the semiconductor element 11 via the adhesive material 19 in this manner, the semiconductor element 11 can be prevented from becoming misaligned due to thermal history, stress, and the like in the step for forming the wiring assembly.

Figure 7:
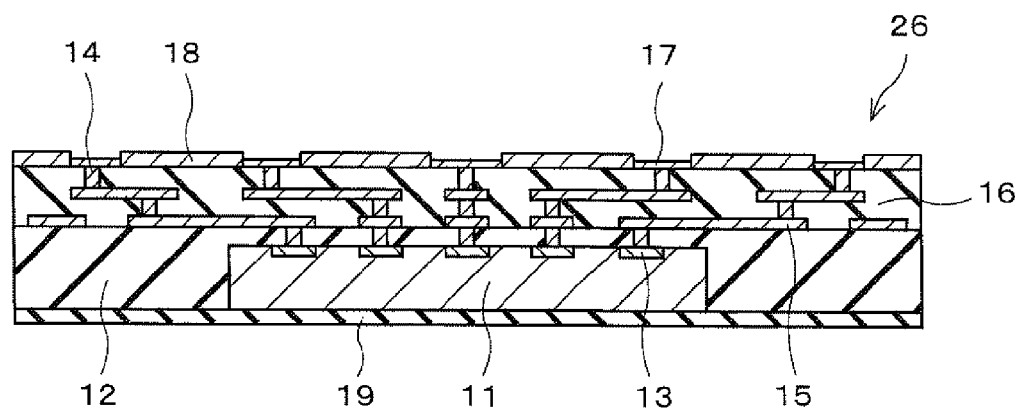
FIG. 7 is a sectional view showing a modification of the semiconductor device according to the second embodiment.

In the semiconductor device of the present embodiment shown in FIG. 6, the adhesive material 19 is provided to the back surface of the semiconductor element 11. This corresponds to providing the adhesive material 19 to the semiconductor device shown in FIG. 5, and the adhesive material 19 may also be provided to the lower surface of the insulation resin 12. As shown in FIG. 7, the adhesive material 19 may be provided to both the back surface of the semiconductor element 11 and the lower surface of the adjacent insulation resin 12. The back side of the semiconductor element 11 is thereby composed of the same material in the same plane, and a heat sink or various types of components can be stably mounted to this surface.

Figure 8:
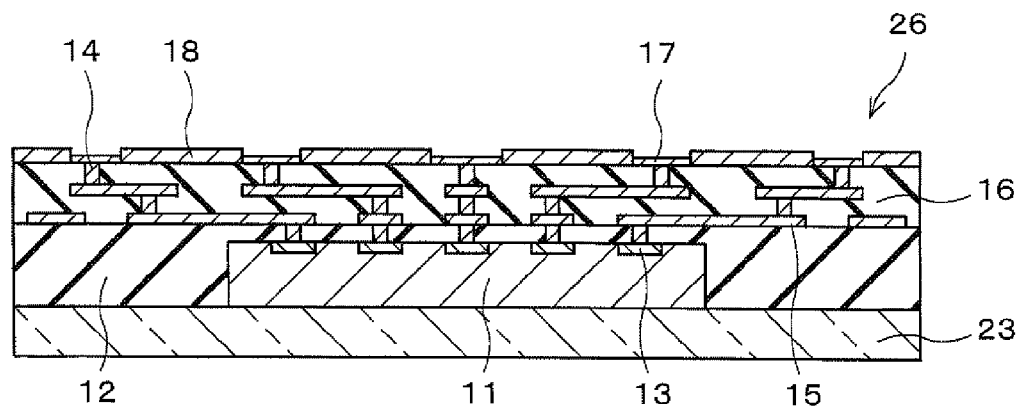
FIG. 8 is a sectional view showing the semiconductor device according to a third embodiment of the present invention.

A third embodiment of the present invention will next be described. FIG. 8 is a sectional view showing the semiconductor device according to the third embodiment. Since items other than those described below in FIG. 8 are the same as in the first embodiment, the same reference symbols are used in FIG. 8 to refer to components that are the same as in FIG. 3, and no detailed description thereof will be given.

As shown in FIG. 8, the semiconductor device 26 of the present embodiment is provided with a transparent board 23 that is in contact with the back surface of the semiconductor element 11 and the adjacent lower surface of the insulation resin 12. Non-alkali glass, metallic glass, soda-lime glass, acrylic class, crystal glass, quartz glass, glass fibers, liquid glass, a glass ceramic, or the like, for example, may be used as the transparent board 23. Aspects of the configuration other than those described above are the same as in the first embodiment shown in FIG. 3, and there are also no positioning marks and depressions/protrusions based on such positioning marks provided to the insulation resin 12 in order to mount the semiconductor element 11.

In the present embodiment, providing the transparent board 23 to the semiconductor device 26 enhances the rigidity of the semiconductor device 26. As a result, a semiconductor device 26 that is free of warping or swelling can be provided. Specifically, since the mechanical strength of the semiconductor device 26 increases, the semiconductor device 26 has minimal deformation when hot, and the secondary packaging reliability when the semiconductor device is packaged in a device is enhanced. Since the transparent board 23 has excellent flatness, heat sinks or various other types of components can be mounted on the lower surface thereof with high precision.

In the present embodiment shown in FIG. 8, the transparent board 23 is provided to the back surface of the semiconductor element 11 of the semiconductor device 26 shown in FIG. 3, but the present invention is not limited to this configuration. For example, the transparent board 23 may be provided to the back surface of the semiconductor element 11 of the semiconductor device 26 shown in any of FIGS. 4 through 7 referenced in the description of the first and second embodiments.

Figure 9:
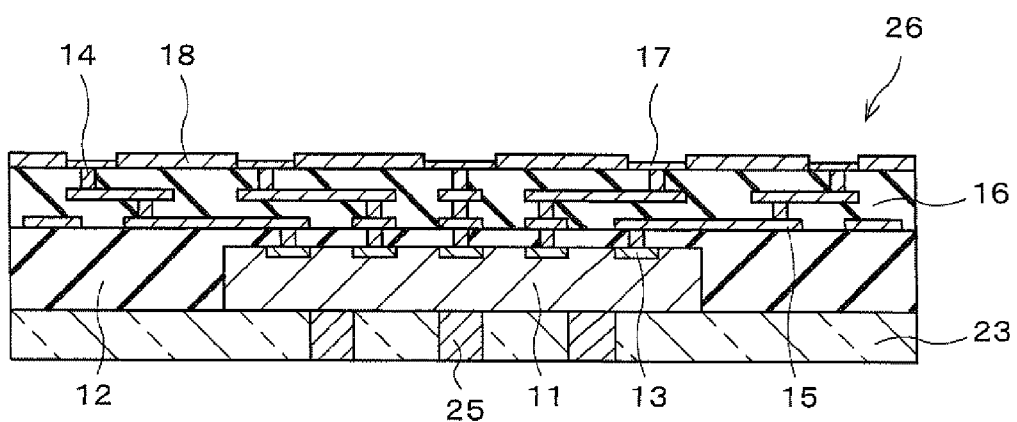
FIG. 9 is a sectional view showing a modification of the semiconductor device according to the third embodiment.

In the semiconductor device of the present embodiment shown in FIG. 8, a metal via 25 having a through-hole is not provided to the transparent board 23, but a metal via 25 may be provided as shown in FIG. 9. Heat generated from the semiconductor element 11 can thereby be efficiently dissipated from the transparent board 23.

Figure 10:
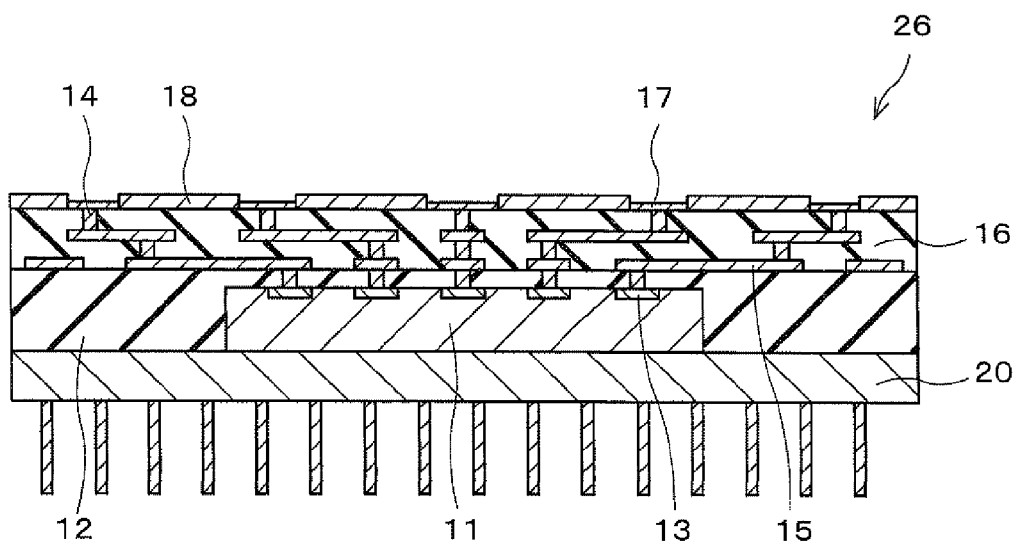
FIG. 10 is a sectional view showing the semiconductor device according to a fourth embodiment of the present invention.

A fourth embodiment of the present invention will next be described. FIG. 10 is a sectional view showing the semiconductor device according to the fourth embodiment. Since items other than those described below in FIG. 10 are the same as in the first embodiment, the same reference symbols are used in FIG. 8 to refer to components that are the same as in FIG. 3, and no detailed description thereof will be given.

As shown in FIG. 10, the semiconductor device 26 of the present embodiment is provided with a heat sink 20 that is in contact with the back surface of the semiconductor element 11, and the lower surface of the adjacent insulation resin 12. Aspects of the configuration other than those described above are the same as in the first embodiment shown in FIG. 3, and there are also no positioning marks and depressions/protrusions based on such positioning marks provided to the insulation resin 12 in order to mount the semiconductor element 11.

In the present embodiment, the heat dissipation properties of the semiconductor device 26 can be enhanced by providing the heat sink 20 to the semiconductor device 26.

In the present embodiment shown in FIG. 10, the heat sink 20 is provided to the back surface of the semiconductor element 11 of the semiconductor device 26, but the present invention is not limited to this configuration. For example, the transparent board 23 may be provided to the back surface of the semiconductor element 11 of the semiconductor device 26 shown in any of FIGS. 4 through 9 referenced in the description of Embodiments 1 through 3, The heat sink 20 shown in FIG. 10 is merely an example, and a stiffener, a heat spreader, or another component, for example, may also be provided to the surface on which the heat sink 20 is mounted.

A fifth embodiment of the present invention will next be described. The present embodiment is an embodiment of the method for manufacturing the semiconductor device according to the first embodiment shown in FIG. 3. FIGS. 11A through 11G are sectional views showing the sequence of steps of the method for manufacturing a semiconductor device according to the fifth embodiment. FIGS. 12A and 12B are a sectional view and a top view, respectively, showing the positioning marks during mounting of the semiconductor element.

Figure 11A:
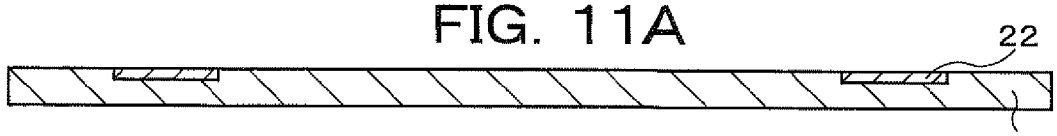
FIGS. 11A through 11G are sectional views showing the sequence of steps in the method for manufacturing a semiconductor device according to a fifth embodiment of the present invention.
Figure 12A:
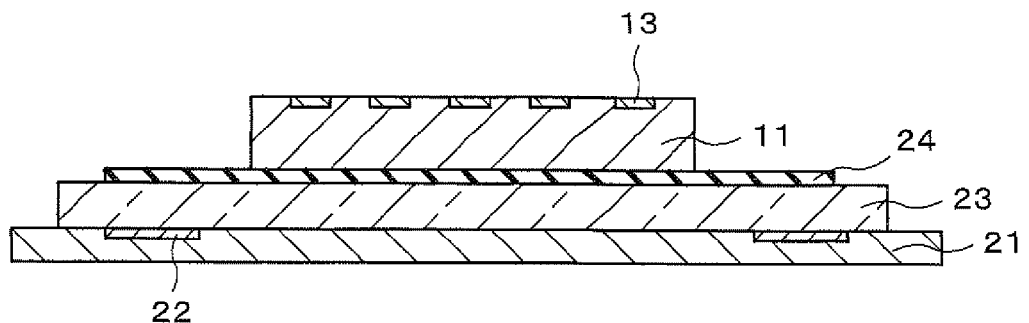
FIGS. 12A and 12B are a sectional view and a top view, respectively, showing the positioning marks when the semiconductor element is mounted.
Figure 12B:
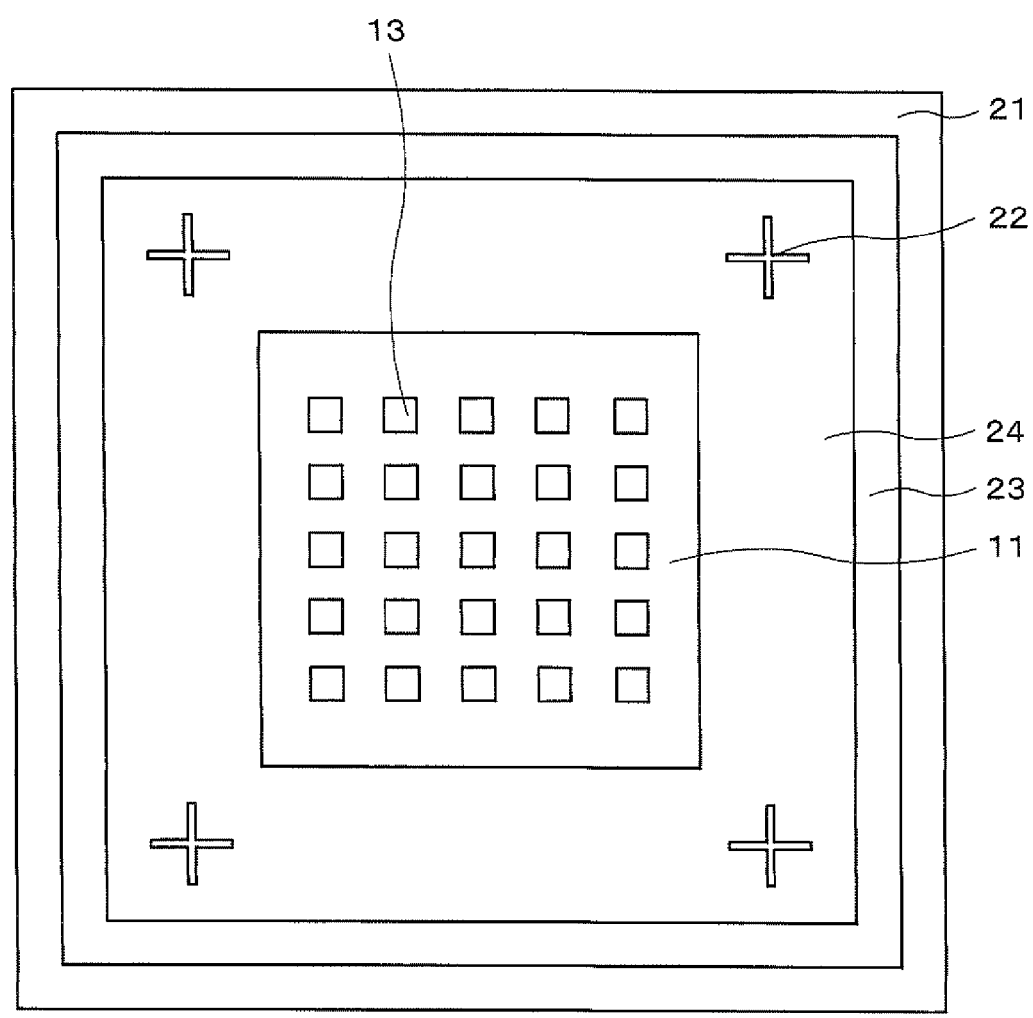

A support board 21 is first prepared on which positioning marks 22 are provided, as shown in FIG. 11A. Resin, metal, glass, or a combination of any thereof may be used as the material of the support board 21. The positioning marks 22 can be recognized with high precision, and may be provided by various methods so as to function as positioning marks 22. For example, it is possible to use a method in which metal is deposited on the support board 21, or a method in which a depression is provided by wet etching or machining. In the present embodiment, the support board 21 is composed of stainless steel having a thickness of 5 mm, and the positioning marks 22 are formed by nickel having a thickness of 5 μm that is formed by electroplating on the support board 21.

Figure 11B:
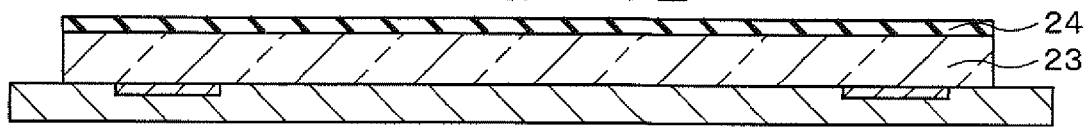

The transparent board 23 is then mounted flat-side-up on the support board 21 provided with the positioning marks 22, as shown in FIG. 11B. Non-alkali glass, metallic glass, soda-lime glass, acrylic class, crystal glass, quartz glass, glass fibers, liquid glass, a glass ceramic, or the like, for example, may be used as the transparent board 23. Even if the transparent board 23 is not visibly transparent, it is sufficient insofar as the positioning marks 22 on the support board 21 can be recognized by radiating solar light, laser light, synchrotron radiation, infrared rays, ultraviolet rays, X rays, or other light. Non-alkali glass is used in the present embodiment. A release material 24 is then provided on the transparent board 23. Adhesion properties are included in the functions of the release material 24, but the release material 24 is preferably cured by irradiation by ultraviolet rays or the like to become a low-adhesive material. Ultraviolet-curable film is used in the present embodiment.

Figure 11C:
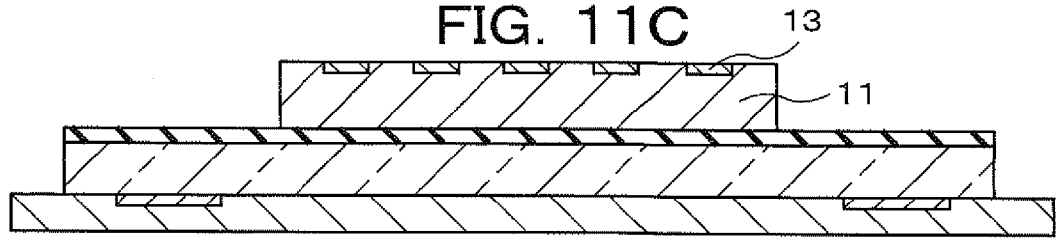

The semiconductor element 11 is then mounted on the transparent board 23 via the release material 24 in a so-called face-up state in which the surface to which the electrode terminal 13 is provided faces upward (opposite side from that of the transparent board 23), as shown in FIG. 11C. At this time, the transparency of the transparent board 23 is utilized to mount the semiconductor element 11 using the positioning marks 22 of the support board 21 as a reference, as shown in FIG. 12. FIGS. 12A and 12B correspond to FIG. 11C, but the length of one side of the transparent board 23 and the release material 24 is made different for the sake of convenience.

Since the non-alkali glass used as the transparent board 23 has extremely minimal warping and swelling in relation to resin and metal even when the size thereof is 1 m×1 m, for example, the semiconductor element 11 can be mounted with high precision. In FIGS. 11 and 12, a single semiconductor element 11 is shown to simplify the description, but a plurality of semiconductor elements 11 may also be mounted. The release material 24 is also preferably transparent and thin in order to facilitate recognition of the positioning marks 22, but holes may also be formed in the portions of the release material 24 that correspond to the positioning marks 22, for example.

Figure 11D:
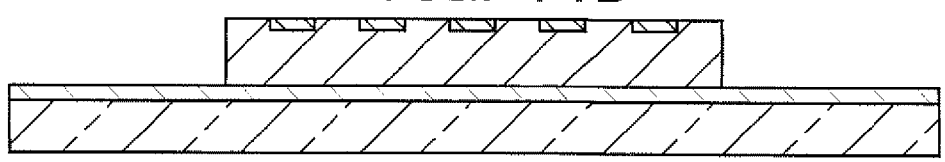

The support board 21 is then removed from the transparent board 23 on which the semiconductor element 11 is mounted, as shown in FIG. 11D. The support board 21 thus removed may be reused.

Figure 11E:
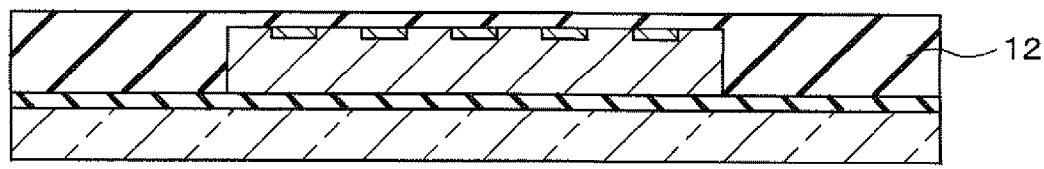

The insulation resin 12 is then layered so that the side surfaces and surface in which the electrode terminal 13 of the semiconductor element 11 is provided are covered, as shown in FIG. 11E. The insulation resin 12 is formed from a photosensitive or non-photosensitive organic material, for example. Examples of organic materials that can be used include epoxy resin, epoxy acrylate resin, urethane acrylate resin, polyester resin, phenol resin, polyimide resin, BCB, PBO, polynorbornene resin, and the like, as well as glass cloth or a woven or nonwoven cloth formed by aramid fibers or the like that is impregnated with epoxy resin, epoxy acrylate resin, urethane acrylate resin, polyester resin, phenol resin, polyimide resin, BCB, PBO, polynorbornene resin, or the like. Examples of the layering method used include transfer molding, compression form molding, printing, vacuum pressing, vacuum lamination, spin coating, die coating, curtain coating, and the like. An epoxy resin is formed using vacuum lamination in the present embodiment. When the insulation resin 12 is formed, a hole may be provided to the organic material in advance in a location that corresponds to the semiconductor element 11.

Figure 11F:
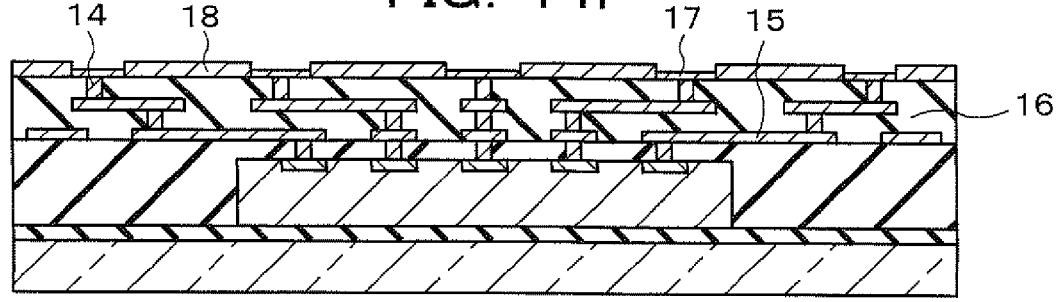

The via 14, the wiring layer 15, and the insulation layer 16 are then formed to electrically connect the external terminal 17 and the electrode terminal 13 on the semiconductor element 11, as shown in FIG. 11F. To form the via 14, an opening is first provided in the insulation resin 12 in a position that corresponds to the via 14. When a photosensitive material is used as the insulation resin 12, the opening is formed by photolithography. When the insulation resin 12 is a non-photosensitive material or a photosensitive material having a low pattern resolution, the opening is formed by laser processing, dry etching, or a blasting method. The opening is formed using laser processing in the present embodiment. One or a plurality of types of metal whose primary component is selected from the group consisting of copper, silver, gold, nickel, aluminum, and palladium is then filled into the opening, and the via 14 is formed. The opening is filled by electroplating, electroless plating, printing, molten metal suction, or another method. The via 14 may also be formed by a process in which the insulation layer 16 is formed after a post for electrical conduction is formed in advance in the position of the via 14, and the surface of the insulation layer 16 is ground down by polishing to expose the conduction post. This method obviates the need for forming an opening in the insulation layer 16.

The wiring layer 15 is formed by a subtractive method, a semi-additive method, a full additive method, or other method. The subtractive method is a method whereby a resist is formed in the desired pattern on a copper foil provided on a board, and the unnecessary copper foil is etched, after which the resist is peeled off to obtain the desired pattern. The semi-additive method is a method whereby a power supply layer is formed by electroless plating, sputtering, CVD (Chemical Vapor Deposition), or another method, after which a resist having the desired pattern in the open portion thereof is formed, metal is deposited by electroplating into the open portion of the resist, and the resist is removed, and the power supply layer is then etched to obtain the desired wiring pattern. The full additive method is a method whereby an electroless plating catalyst is deposited on a board, after which a pattern is formed in the resist, the catalyst is activated while the resist remains as an insulation film, and the desired wiring pattern is obtained by depositing metal in the open portion of the insulation film by electroless plating. The primary component of the wiring layer 15 is one or more types of metal selected from the group consisting of copper, silver, gold, nickel, aluminum, and palladium. Copper is particularly preferred from the perspectives of electrical resistance and cost. The wiring layer 15 is formed by copper using the semi-additive method in the present embodiment.

The insulation layer 16 is formed from a photosensitive or non-photosensitive organic material, for example. Examples of organic materials that can be used include epoxy resin, epoxy acrylate resin, urethane acrylate resin, polyester resin, phenol resin, polyimide resin, BCB, PBO, polynorbornene resin, and the like, as well as glass cloth or a woven or nonwoven cloth formed by aramid fibers or the like that is impregnated with epoxy resin, epoxy acrylate resin, urethane acrylate resin, polyester resin, phenol resin, polyimide resin, BCB, PBO, polynorbornene resin, or the like. Epoxy resin is used in the present embodiment. The insulation layer 16 may be layered using the same method as the abovementioned method for layering the insulation resin 12. An example in which there are two layers of conductors and three layers of insulation is shown in FIG. 11, but the steps for forming the via 14, the wiring layer 15, and the insulation layer 16 may be repeated according to the desired number of layers.

The pattern of the solder resist 18 is then formed on the uppermost wiring layer 15. The solder resist 18 is formed to provide flame retardant properties and surface circuit protection to the semiconductor device 26. The material of the solder resist 18 is composed of an epoxy-based, acrylic-based, urethane-based, or polyimide-based organic material, and an inorganic or organic filler may also be added as needed. A photosensitive resist ink, for example, may be used as the solder resist 18. A photosensitive resist ink is used in the present embodiment. The external terminal 17 is then formed on the surface exposed from the solder resist 18. The same material as the wiring layer 15 may be selected and used as the external terminal 17, and one or more types of metal selected from the group consisting of gold, silver, copper, tin, and solder material may be formed on the surface of the external terminal 17. In the present embodiment, a nickel layer having a thickness of 3 µm and a gold layer having a thickness of 0.5 µm are layered in sequence on the surface of the external terminal 17. The solder resist 18 is used in the present embodiment, but a configuration may also be adopted for the semiconductor device 26 in which the solder resist 18 is not used.

Figure 11G:
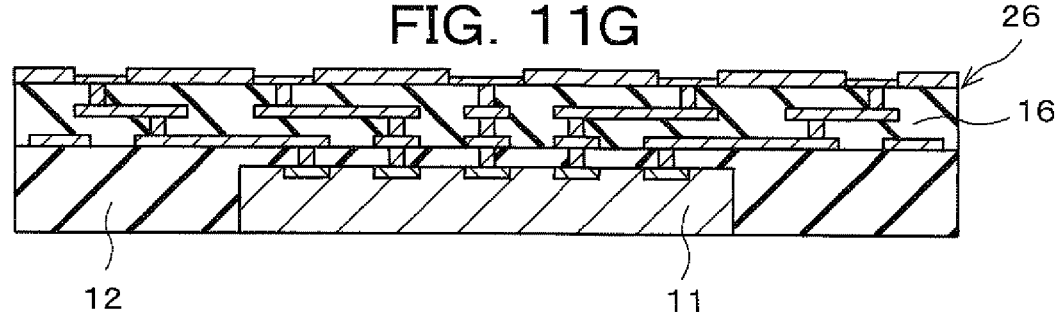

The transparent board 23 is then peeled from the semiconductor device 26, as shown in FIG. 11G. Ultraviolet rays are radiated to the release material 24 from the lower surface of the transparent board 23 at this time. As described above, since the ultraviolet-curable release material 24 is used in the present embodiment, the adhesion of the release material 24 can be reduced by ultraviolet radiation, and the transparent board 23 can easily be peeled from the semiconductor device 26. The semiconductor device 26 of the present embodiment is obtained by the process described above. The insulation resin 12 and the back surface of the semiconductor element 11 are in the same plane in FIG. 11G, but a configuration may also be adopted in which the back surface of the semiconductor element 11 protrudes or is recessed in relation to the insulation resin 12. In this case, one or both of the semiconductor element 11 and insulation resin 12 may be removed by dry etching, wet etching, machining, or another method, and material may be layered using electroplating, CVD, or another method.

In the manufacturing method of the present embodiment, the positioning marks 22 are provided on the support board 21, the transparent board 23 is positioned thereon, and the semiconductor device 26 is formed on the transparent board 23. The positioning marks 22 provided to the support board 21 are utilized through the use of a transparent board 23 having excellent transparency, and there is therefore no need for a step to form the positioning marks 22 on the semiconductor device 26. Since the support board 21 can be reused, the number of steps needed to form the positioning marks can be reduced. Since the glass plate used as the transparent board 23 has extremely minimal warping, swelling, and surface irregularities, the semiconductor element 11 can be mounted with high precision even when the glass plate is large. Furthermore, providing the release material 24 to the upper surface of the transparent board 23 makes it possible to easily peel the transparent board 23 from the semiconductor device 26 in the above-described manner. As described above, the manufacturing method of the present embodiment makes it possible to fabricate a low-cost semiconductor device while mounting the semiconductor element with high precision.

A sixth embodiment of the present invention will next be described. The present embodiment is an embodiment of the method for manufacturing the semiconductor device according to the second embodiment shown in FIG. 6. FIGS. 13A through 13G are sectional views showing the sequence of steps of the method for manufacturing a semiconductor device according to the sixth embodiment.

Figure 13A:
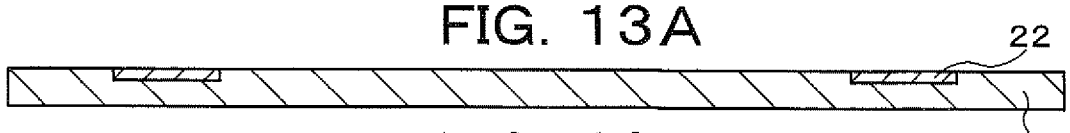
FIGS. 13A through 13G are sectional views showing the sequence of steps in the method for manufacturing a semiconductor device according to a sixth embodiment of the present invention.
Figure 13B:
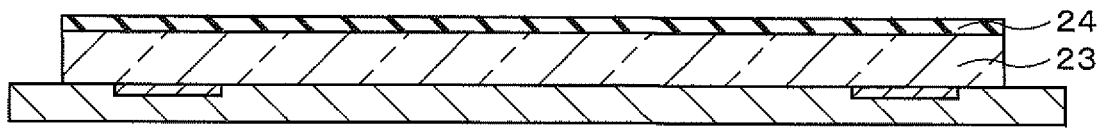

The transparent board 23 is first mounted on the support board 21 to which the positioning marks 22 are provided, and the release material 24 is formed thereon, as shown in FIGS. 13A and 13B. The abovementioned step is the same as in the method for manufacturing a semiconductor device according to the fifth embodiment. No detailed description will be given below for steps in the manufacturing method that are the same as those of the fifth embodiment.

Figure 13C:
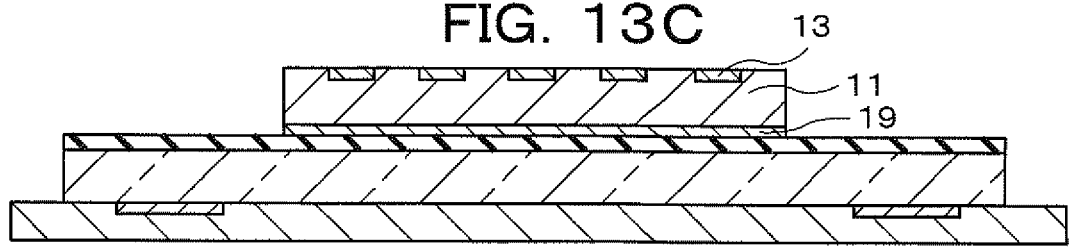
Figure 13D:
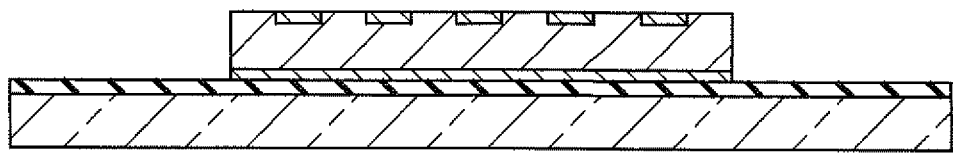

The adhesive material 19 is then formed on the release material 24, as shown in FIG. 13C. The adhesive material 19 is a photosensitive or non-photosensitive organic material, for example. Examples of materials that can be used as the adhesive material 19 include epoxy resin, epoxy acrylate resin, urethane acrylate resin, polyester resin, phenol resin, polyimide resin, BCB, PBO, polynorbornene resin, and the like. Epoxy resin is used in the present embodiment. The semiconductor element 11 is then mounted on the adhesive material 19. At this time, the semiconductor element 11 is mounted on the transparent board 23 in a so-called face-up state so that the surface of the semiconductor element 11 to which the electrode terminal 13 is provided faces upward, the same as in the fifth embodiment.

Figure 13E:
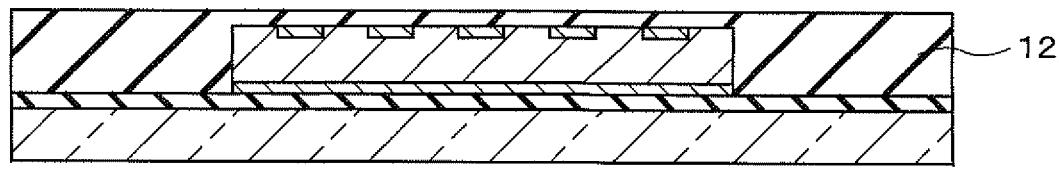
Figure 13F:
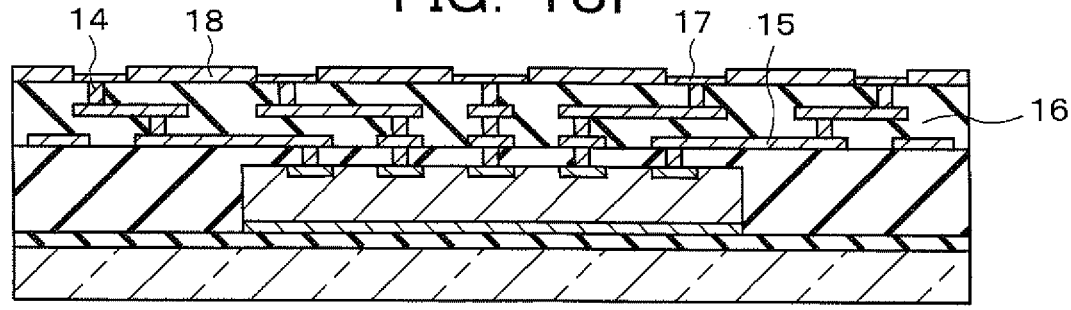
Figure 13G:
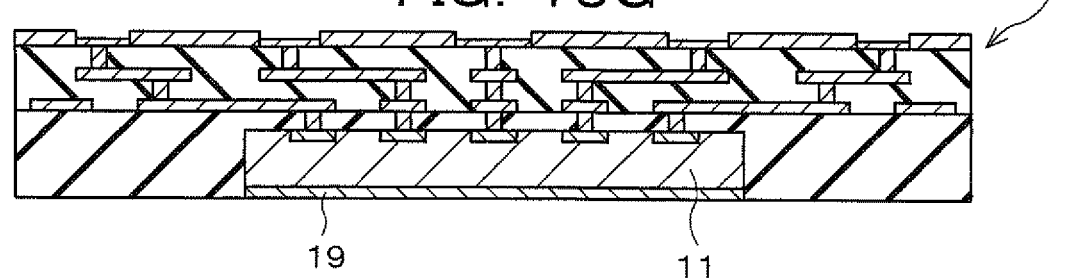

The insulation resin 12, the via 14, the wiring layer 15, the insulation layer 16, the external terminal 17, and the solder resist 18 are then formed as shown in FIGS. 13E through 13G. The transparent board 23 is then peeled from the semiconductor device 26. The abovementioned steps are the same as in the fifth embodiment. The semiconductor device 26 of the present embodiment is obtained by the process described above.

In the manufacturing method of the present embodiment, the semiconductor element 11 is mounted on the release material 24 via the adhesive material 19. As described above, the release material 24 preferably retains adhesive properties until the peeling step, but the presence of the adhesive material 19 further increases the adhesion of the semiconductor element 11. The semiconductor element 11 can thereby be effectively prevented from becoming misaligned due to thermal history, stress, and other effects in the steps for forming the wiring assembly. As described above, the manufacturing method of the present embodiment makes it possible to maintain high precision in the mounting of the semiconductor element 11.

A seventh embodiment of the present invention will next be described. The present embodiment is an embodiment of the method for manufacturing the semiconductor device according to the third embodiment shown in FIG. 8. FIGS. 14A through 14F are sectional views showing the sequence of steps in the method for manufacturing a semiconductor device according to the seventh embodiment.

Figure 14A:
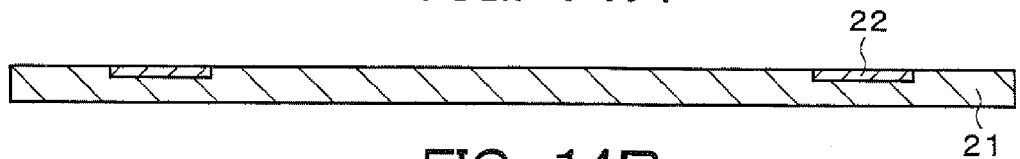
FIGS. 14A through 14F are sectional views showing the sequence of steps in the method for manufacturing a semiconductor device according to a seventh embodiment of the present invention.

A support board 21 is first prepared in which positioning marks 22 are provided, as shown in FIG. 14A.

Figure 14B:

The transparent board 23 is then mounted on the support board 21 to which the positioning marks 22 are provided, as shown in FIG. 14B. Non-alkali glass, metallic glass, soda-lime glass, acrylic class, crystal glass, quartz glass, glass fibers, liquid glass, a glass ceramic, or the like, for example, may be used as the transparent board 23. Even if the transparent board 23 is not visibly transparent, it is sufficient insofar as the positioning marks 22 on the support board 21 can be recognized by radiating solar light, laser light, synchrotron radiation, infrared rays, ultraviolet rays, X rays, or other light. Non-alkali glass is used in the present embodiment. A penetrating via 25 such as the one shown in FIG. 7 may also be provided to the transparent board 23. The heat of the semiconductor element 11 can thereby be efficiently dissipated from the transparent board 23.

Figure 14C:
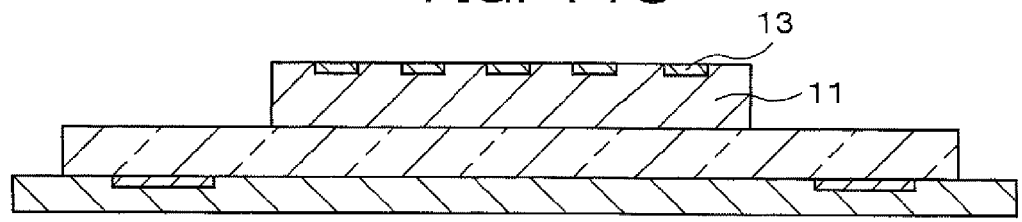

The semiconductor element 11 is then mounted on the transparent board 23 in a so-called face-up state so that the surface of the semiconductor element 11 to which the electrode terminal 13 is provided faces upward, as shown in FIG. 14C. In this instance, the transparency of the transparent board 23 is utilized to mount the semiconductor element 11 using the positioning marks 22 of the support board 21 as a reference, the same as in the fifth embodiment.

Figure 14D:
Figure 14E:
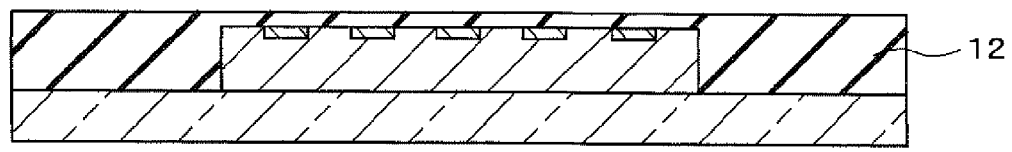
Figure 14F:
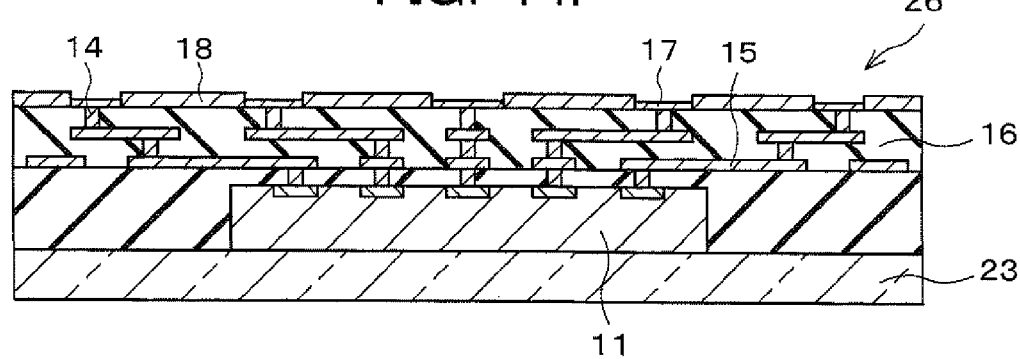

The support board 21 is then removed from the transparent board 23 on which the semiconductor element 11 is mounted, as shown in FIG. 14D. The insulation resin 12, the via 14, the wiring layer 15, the insulation layer 16, the external terminal 17, and the solder resist 18 are then formed as shown in FIGS. 14E through 14F. The steps mentioned above are the same as in the fifth embodiment. In the manufacturing method of the present embodiment, the transparent board 23 is not removed from the semiconductor element 11 and the insulation resin 12. The semiconductor device 26 of the present embodiment is thus obtained by integrating the transparent board 23 with the semiconductor element 11 and the insulation resin 12.

In the manufacturing method of the present embodiment, the semiconductor device 26 is fabricated by integrating the transparent board 23 with the semiconductor element 11 and the insulation resin 12. A semiconductor device 26 that has minimal warping and swelling can thereby be fabricated, and reliability can be enhanced. As described in the fifth embodiment above, the present embodiment has the same effects in that there is no need for a step for forming the positioning marks for the semiconductor device 26 in the manufacturing process, and the semiconductor element 11 can be mounted with high precision.

What is claimed is:

1. A semiconductor device, comprising:
a semiconductor element having an electrode terminal;
a first insulation layer formed so as to seal a side surface of the semiconductor element and a top surface of the semiconductor element, the top surface provided with said electrode terminal;
a second insulation layer formed on a top surface of said first insulating layer, said second insulating layer having a plurality of stacked wiring layers formed therein electrically connected exclusively to said electrode terminal,
wherein a bottom surface of said first insulating layer opposite from the top surface of said first insulating layer is flat and is parallel to a bottom surface of said semiconductor element.

2. The semiconductor device according to claim 1, wherein the bottom surface of said semiconductor element is in the same plane as said flat bottom surface of said first insulation layer.

3. The semiconductor device according to claim 1, wherein the bottom surface of said semiconductor element protrudes from said flat bottom surface of said first insulation layer.

4. The semiconductor device according to claim 1, wherein the bottom surface of said semiconductor element is recessed from said flat bottom surface of said first insulation layer.

5. The semiconductor device according to claim 1, wherein a cured adhesion layer is formed on the bottom surface of said semiconductor element.

6. The semiconductor device according to claim 1, wherein a cured adhesion layer is formed on said flat bottom surface of said first insulation layer.

7. The semiconductor device according to claim 1, wherein a cured adhesion layer is formed on the bottom surface of said semiconductor element, and on said flat bottom surface of said first insulation layer.

8. The semiconductor device according to claim 1, wherein a transparent board is provided to the bottom surface of said semiconductor element.

9. The semiconductor device according to claim 8, wherein said transparent board is a glass board.

10. The semiconductor device according to claim 8, wherein a metal via that passes through the transparent board is provided to said transparent board.

11. The semiconductor device according to claim 1, wherein a heat sink is provided to the bottom surface of said semiconductor element.

12. A semiconductor device, comprising:
a semiconductor element having an upper surface and a lower surface opposite to the upper surface with a side surface provided therebetween;
an electrode terminal exposed at said upper surface of said semiconductor element;
an insulation layer formed along said side and upper surfaces of said semiconductor element partially covering said exposed electrode terminal; and
a wiring layer having a lower surface disposed on an upper surface of said insulating layer and electrically connected to said electrode terminal, the wiring layer including a plurality of conductive vias formed therein, and an external terminal and solder resist formed on an upper surface of said wiring layer,
wherein a lower surface of said insulation layer opposite from said upper surface of said insulation layer includes an entirely planar surface that is parallel to said lower surface of said semiconductor element.

13. The semiconductor device according to claim 12, wherein said lower surface of said semiconductor element is in the same plane as said lower surface of said insulation layer.

14. The semiconductor device according to claim 13, further comprising a heat sink contacting said lower surface of said insulating layer and said lower surface of said semiconductor element.

15. The semiconductor device according to claim 12, wherein said lower surface of said semiconductor element protrudes from said lower surface of said insulation layer.

16. The semiconductor device according to claim 12, wherein said lower surface of said semiconductor element is recessed from said lower surface of said insulation layer.

17. The semiconductor device according to claim 12, further comprising a transparent board provided on said lower surface of said insulation layer.

18. The semiconductor device according to claim 17, wherein said transparent board is a glass board.

19. The semiconductor device according to claim 17, further comprising a metal via passing through the transparent board and contacting said lower surface of said semiconductor element.

20. The semiconductor device according to claim 12, wherein said solder resist exposes a portion of said external terminal and covers a remaining portion of said upper surface of said wiring layer.

* * * * *